United States Patent [19]

Uematsu

[11] Patent Number: 5,598,010

[45] Date of Patent: Jan. 28, 1997

[54] SEMICONDUCTOR INTEGRATED CIRCUIT DEVICE HAVING DUMMY PATTERN EFFECTIVE AGAINST MICRO LOADING EFFECT

[75] Inventor: Yoshihide Uematsu, Tokyo, Japan

[73] Assignee: NEC Corporation, Tokyo, Japan

[21] Appl. No.: 648,716

[22] Filed: May 16, 1996

Related U.S. Application Data

[63] Continuation of Ser. No. 358,369, Dec. 19, 1994, abandoned.

[30] Foreign Application Priority Data

Dec. 24, 1993 [JP] Japan .................................. 5-326667

[51] Int. Cl.[6] .......................... H01L 21/56; H01L 29/78; H05K 3/12
[52] U.S. Cl. ......................... 257/48; 257/170; 257/354; 257/401; 257/409; 257/773
[58] Field of Search ..................................... 257/773, 774, 257/154, 155, 170, 173, 177, 178, 181, 205, 328, 333, 334, 345, 354, 392, 395, 396–403, 409, 48

[56] References Cited

U.S. PATENT DOCUMENTS

| | | | |
|---|---|---|---|
| 3,586,930 | 6/1971 | Heath et al. | 257/401 |
| 5,410,161 | 4/1995 | Narita | 257/41 |

FOREIGN PATENT DOCUMENTS

| | | | |
|---|---|---|---|
| 100837 | 6/1988 | Japan | H01L 21/66 |
| 251631 | 10/1989 | Japan | H01L 21/66 |
| 0100250 | 4/1992 | Japan | 257/48 |

Primary Examiner—Sara W. Crane
Assistant Examiner—Alexander Oscar Williams
Attorney, Agent, or Firm—Sughrue, Mion, Zinn, Macpeak & Seas

[57] ABSTRACT

A semiconductor integrated circuit device has a test component associated with a dummy test pattern for evaluating corresponding circuit components of the integrated circuit, and the test component and the dummy test pattern is surrounded by a peripheral dummy pattern so that a micro loading effect on the test component is equivalent to the corresponding circuit components.

6 Claims, 10 Drawing Sheets

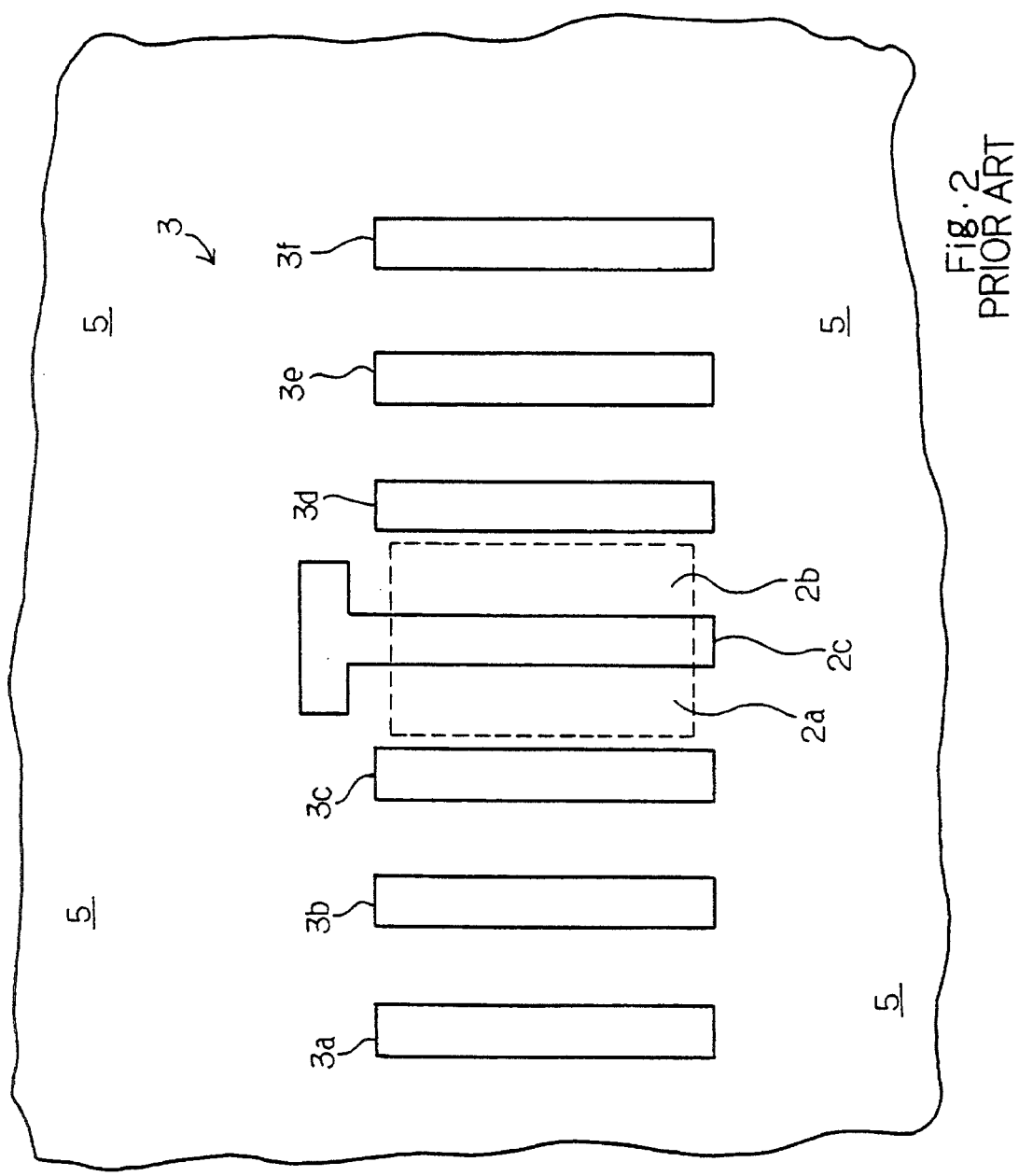

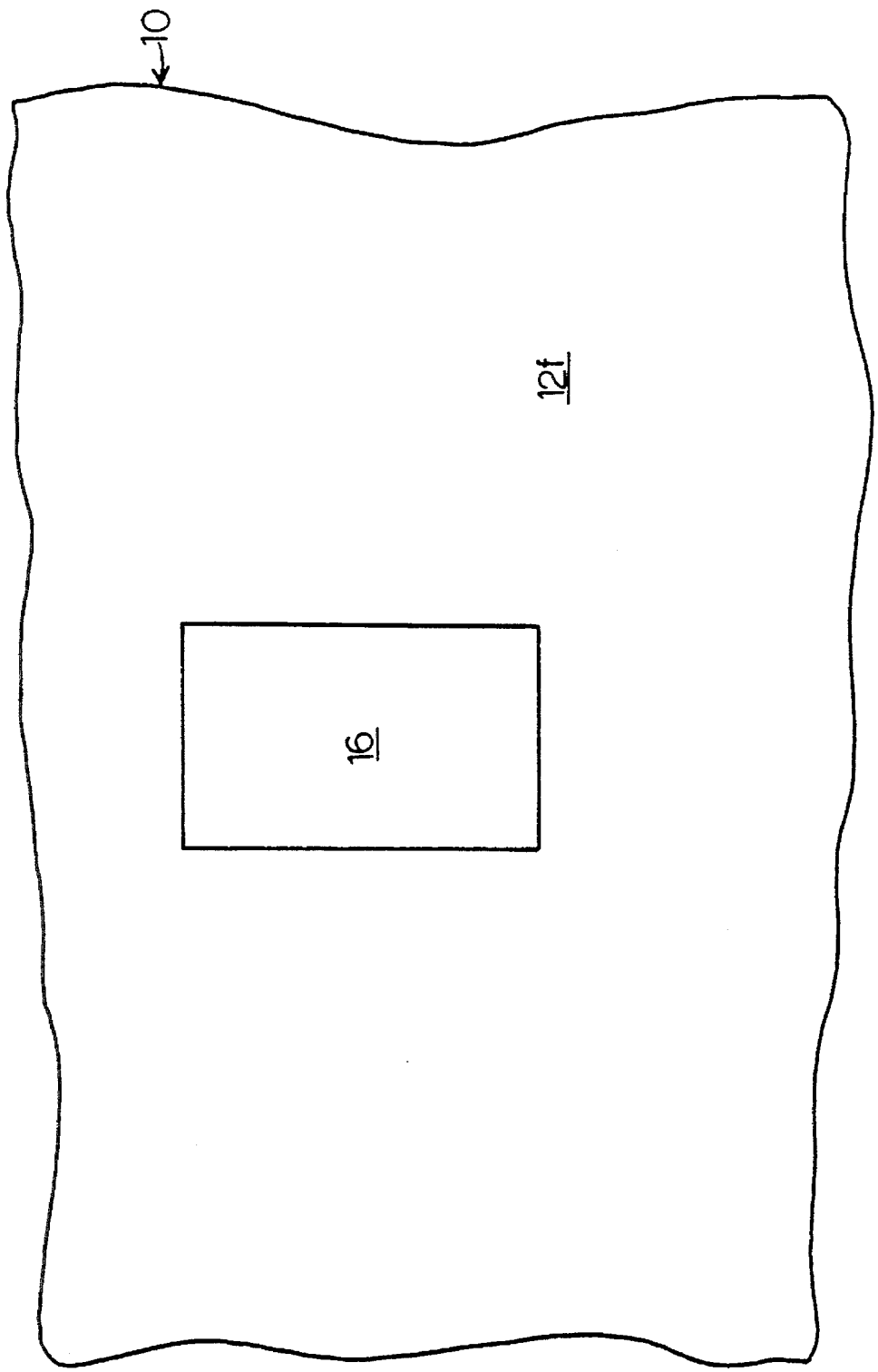

5,598,010

1

SEMICONDUCTOR INTEGRATED CIRCUIT DEVICE HAVING DUMMY PATTERN EFFECTIVE AGAINST MICRO LOADING EFFECT

This is a Continuation of application Ser. No. 08/358,369 filed Dec. 19, 1994, now abandon.

FIELD OF THE INVENTION

This invention relates to a semiconductor integrated circuit device and, more particularly, to a semiconductor integrated circuit device having a dummy pattern effective against a micro loading effect.

DESCRIPTION OF THE RELATED ART

A semiconductor device is fabricated on a monolithic semiconductor substrate, and a test pattern area is formed on the semiconductor substrate together with a major area assigned to the integrated circuit. Various circuit components, fundamental component units, electrode pads for test probes and wirings are formed in the test pattern area, and are used for evaluating corresponding circuit components and fundamental component units incorporated in the integrated circuit.

In a fabrication process for the semiconductor integrated circuit device, semiconductor chips are assigned to respective chip areas of a semiconductor wafer, and the integrated circuits are respectively fabricated on the semiconductor chips. However, all of the semiconductor chips are not identical in configuration with one another, and scribe areas are required for separation of the semiconductor chips. Moreover, the pattern density in each chip area is not uniform. For this reason, a target pattern in each etching stage does not uniformly have pattern components over the semiconductor wafer, and is causative of the loading effect.

The loading effect takes place in, for example, an etching for a large amount of etchable surface area, and the etching rate is decreased as the amount of etchable surface area is increased. The loading effect occurs when the active etchant rapidly reacts with the material being etched, but the etchant has a long lifetime in the absence of etchable material. Etching is then the primary loss mechanism for the etchant, so the greater the area of material, the more etchant species are consumed. The loading pattern is observed in an ion implantation, and is undesirable for the miniaturization of the circuit components.

As described hereinbefore, the pattern components are usually not uniform over the semiconductor wafer, and the etching rate is varied depending upon the density of the pattern components due to the loading effect. A dummy pattern is incorporated in the target pattern so as to make the density of the pattern components uniform, and is effective against the loading effect.

The loading effect takes place not only in the chip area but also in the test pattern area, and the dummy pattern is also formed in the test pattern area. In fact, the test pattern area is usually formed in a vacant area of the chip area, and the electrode pads usually occupy an area tens to hundreds times wider than an occupation area of the test component. This means that the loading effect has a strong influence on the test pattern area, and the test component tends to be damaged. For this reason, the test pattern area requires a dummy pattern.

Japanese Utility Model Publication of Unexamined Application No. 63-100837 discloses the dummy pattern formed in the test pattern area, and is illustrated in FIG. 1 of the drawings. In the test pattern area 1, a MOS test transistor 2 is fabricated together with a dummy pattern 3 or a plurality of dummy gate electrodes 3a, 3b, 3c, 3d, 3e and 3f. The MOS test transistor 2 comprises source and drain regions 2a and 2b formed in the test pattern area 1, a gate oxide layer covering a channel region between the source region 2a and the drain region 2b and a gate electrode 2c provided on the gate oxide layer. A source electrode pad 4a is held in contact with the source region 2a through contact holes, and a drain electrode 4b is held in contact with the drain region 2b through contact holes. The gate electrode 2c is held in contact with a gate electrode pad 4c through contact holes, and the MOS test transistor 2 is available for evaluating MOS component transistors of the integrated circuit by appropriately biasing the electrode pads 4a to 4c.

The dummy gate electrodes 3a to 3c are provided on the left side of the gate electrode 2c, and the other dummy gate electrodes 3d to 3f are provided on the right side of the gate electrode 2c. The dummy gate electrodes 3a to 3f makes the density of the pattern components around the gate electrode 2c equivalent to that of the gate electrodes of the MOS transistors incorporated in the integrated circuit.

Japanese Patent Publication of Unexamined Application No. 1-251631 discloses a dummy pattern formed in the vacant area. The dummy pattern makes the pattern density in the entire surface of the semiconductor wafer as well as the pattern density in the entire surface of the chip area uniform, and suppresses the loading effect.

However, the gate electrode 2c is over etched due to strong suppression of a micro loading effect. In detail, the micro loading effect is observed in a dry etching process where various stages such as an adhesion of etching species to a material to be etched, a reaction between the etching species and the material, a dissociation of the reaction product and an evaporation of the reaction product concurrently proceed. The miniaturization of circuit components requires higher degree of anisotropy, and the vapor pressure of the etchant and the substrate bias are increased. The high vapor pressure presses the reaction product against the material, and does not allow the reaction product to rapidly leave the surface of the material. The reaction product prohibits the etching species from adhesion to the non-reacted material, and undesirable under-etch and a bowing are liable to take place. This phenomenon is called a "micro loading effect", and the prior art dummy pattern 3 strongly suppresses the micro loading effect on the test component such as the MOS test transistor rather than the major pattern of the integrated circuit such as a gate electrode pattern of the component field effect transistors. As a result, the gate electrode 2c is over etched, and becomes too narrow to exactly evaluate the transistor characteristics of the corresponding circuit components of the integrated circuit.

SUMMARY OF THE INVENTION

It is therefore an important object of the present invention to provide a semiconductor integrated circuit device a dummy pattern of which makes a micro loading effect equivalent between a test pattern and a major pattern of an integrated circuit.

The present inventor contemplated the micro loading effect. The present inventor noticed that the dummy gate electrodes 3a to 3f are surrounded by a wide vacant area 5 and that a major pattern in the major area was surrounded by other circuit components. The present inventor concluded that the wide vacant area 5 suppressed the micro loading effect, because the reaction product easily escapes from the vicinity of the dummy gate electrodes 3a to 3f to the wide vacant area.

To accomplish the object, the present invention proposes to surround a central dummy pattern with a peripheral dummy pattern.

In accordance with the present invention, there is provided a semiconductor integrated circuit device fabricated on a semiconductor substrate having a major area and a test pattern area, comprising: a) an integrated circuit formed in the major area, and having a plurality of circuit components and a second circuit component, a plurality of pattern components being incorporated in the plurality of circuit components at intervals, the second circuit component being spaced from the plurality of pattern components by a first distance; b) a test component having a test pattern and used for evaluating at least one of the plurality of circuit components; and c) a peripheral dummy pattern surrounding the test component and spaced from the test pattern by a second distance equal to the first distance, the peripheral dummy pattern and the test pattern being concurrently patterned together with the plurality of pattern components.

The semiconductor integrated circuit device may further comprise a plurality of dummy test components concurrently formed inside of the peripheral dummy pattern, and the test pattern and the dummy test components may be spaced at second intervals equal to the first intervals.

BRIEF DESCRIPTION OF THE DRAWINGS

The features and advantages of the semiconductor integrated circuit device according to the present invention will be more clearly understood from the following description taken in conjunction with the accompanying drawings in which:

FIG. 2 is a plan view showing the prior art dummy pattern incorporated in the test pattern area;

FIGS. 4A to 4C are plan views showing a process sequence for fabricating the test component, the dummy pattern components and the peripheral dummy pattern;

DESCRIPTION OF THE PREFERRED EMBODIMENTS

First Embodiment

Figure 1:
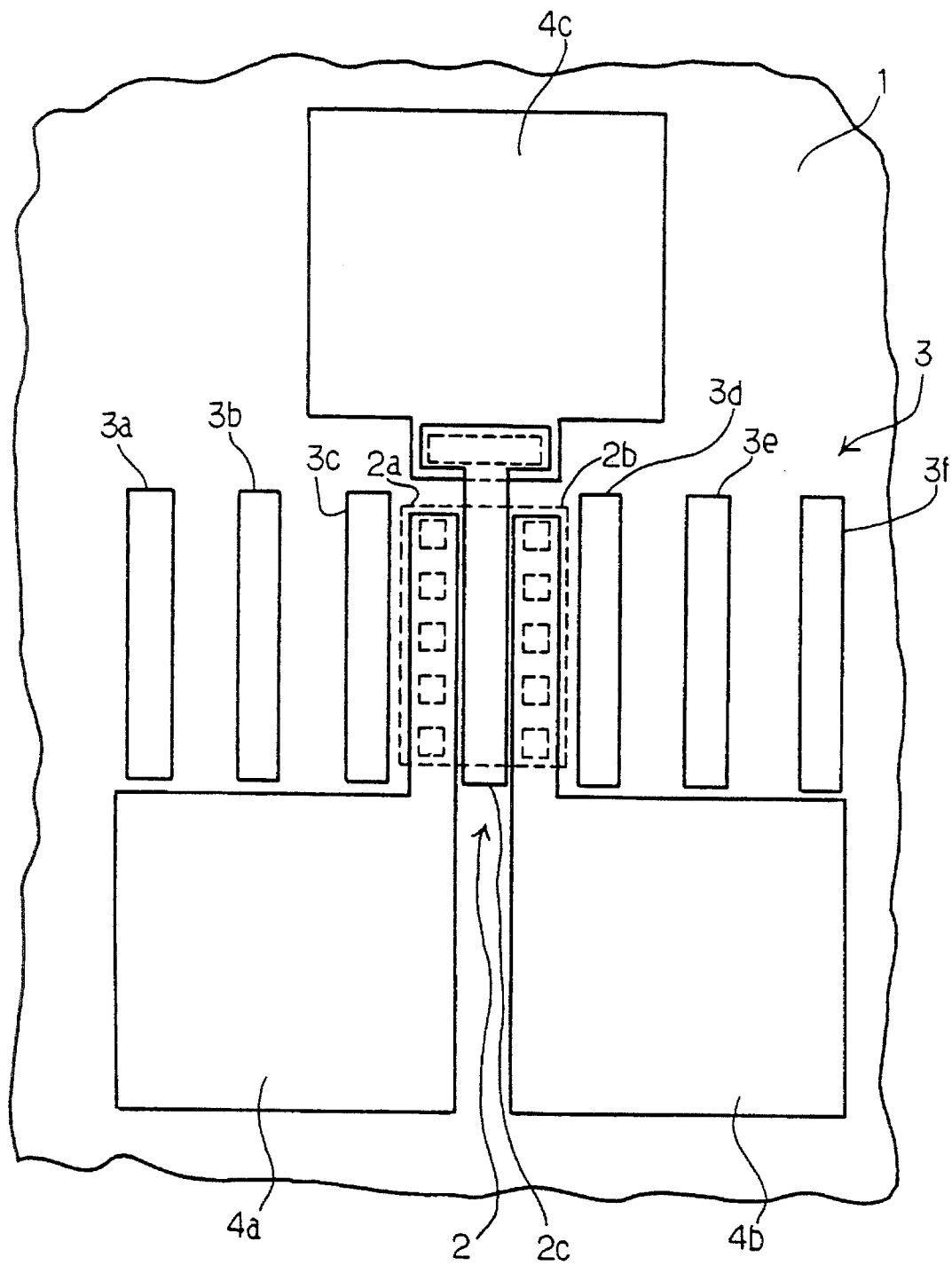
FIG. 1 is a plan view showing the prior art dummy pattern for the MOS test transistor.
Figure 3A:
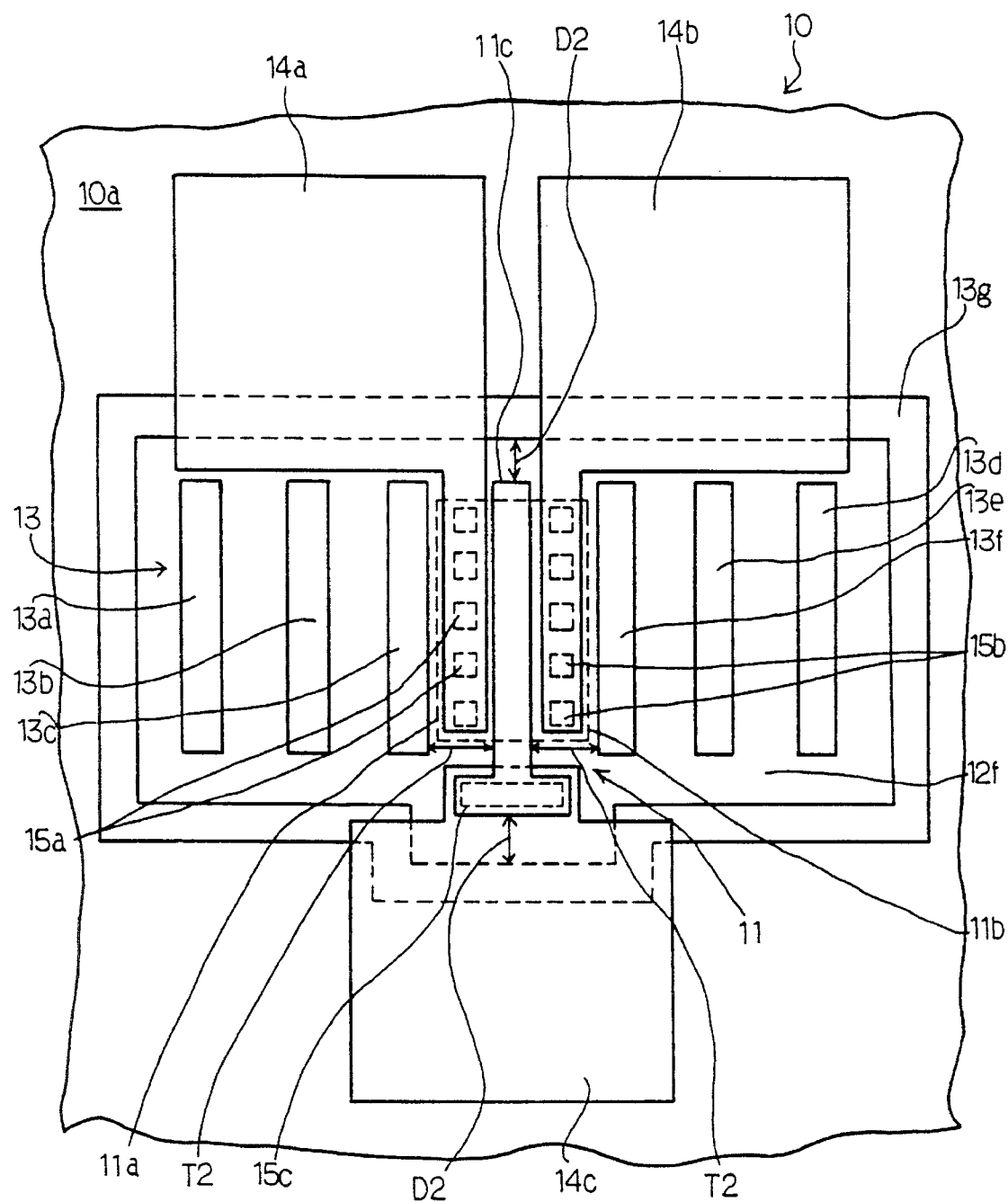
FIG. 3A is a plan view showing a test component, dummy pattern components and a peripheral dummy pattern incorporated in a semiconductor integrated circuit device according to the present invention.
Figure 3B:
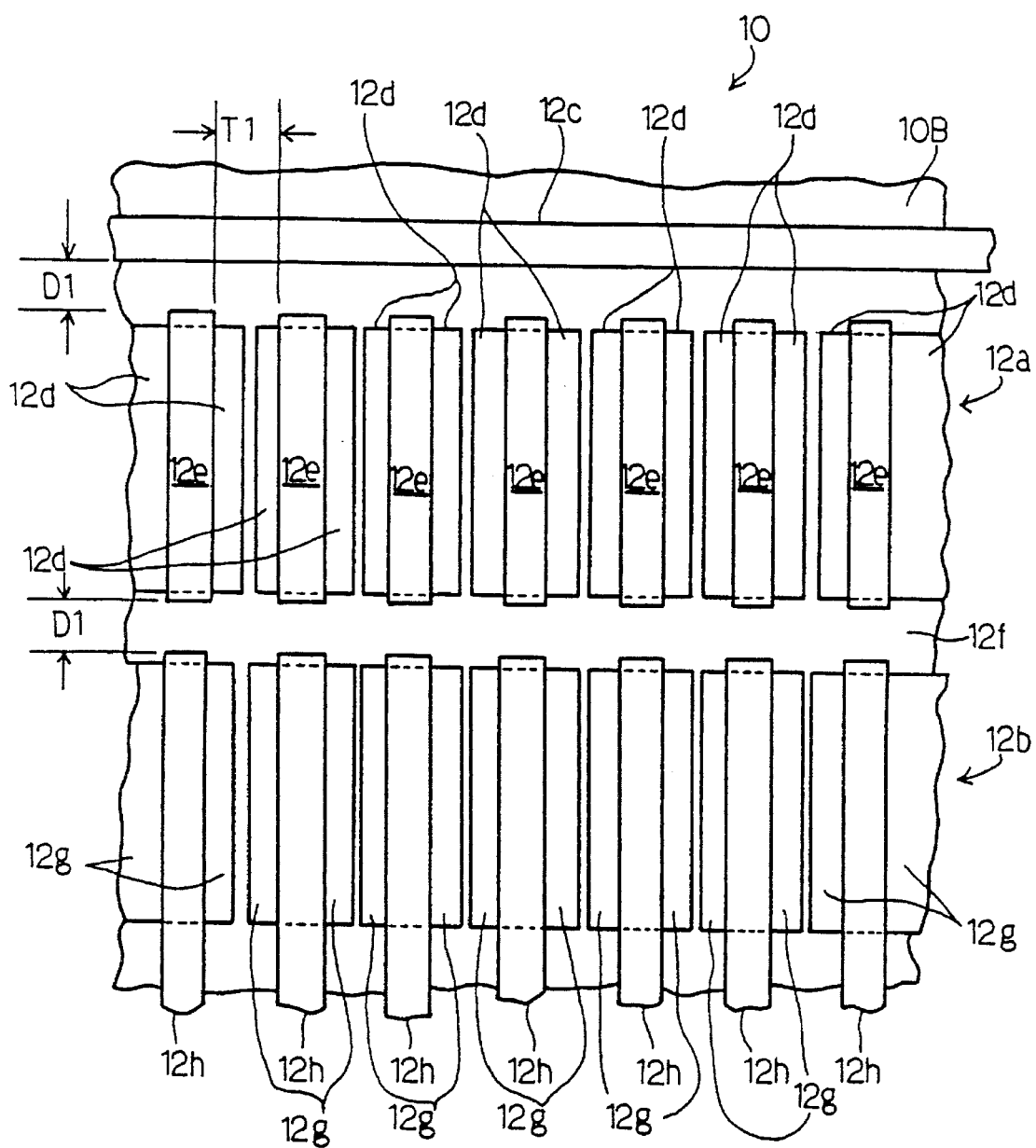
FIG. 3B is a plan view showing a part of an integrated circuit incorporated in the semiconductor integrated circuit device.

Referring to FIGS. 3A and 3B of the drawings, a semiconductor integrated circuit device embodying the present invention is fabricated on a semiconductor substrate 10, and the major surface of the semiconductor substrate has a test pattern area 10a (see FIG. 3A), a major area 10b (see FIG. 3B) and a vacant area (not shown). The test pattern area 10a is assigned to test circuit components such as an n-channel enhancement type test transistor 11, and the major area 10b is assigned to an integrated circuit.

A plurality of n-channel enhancement type field effect transistors 12a and 12b and a signal line 12c are incorporated in the integrated circuit, and the plurality of n-channel enhancement type field effect transistors 12a and 12b are arranged into two rows. Each of the n-channel enhancement type field effect transistors 12a has a pair of n-type impurity regions 12d serving as source and drain regions, a gate insulating film (not shown) covering a channel region between the source and drain regions 12d and a gate electrode 12e, and the pair of n-type impurity regions 12d is surrounded by a thick field oxide layer 12f. Each of the n-channel enhancement type field effect transistors 12b also has a pair of n-type impurity regions 12g, a gate insulating film (not shown) and a gate electrode 12h. Though not shown in FIG. 3B, a ground voltage line is connected to the source regions 12d, and the drain regions are connected to respective signal lines. The gate electrodes 12e are connected with respective control signal lines (not shown), and the control signal lines passes through respective contact holes formed in an inter-level insulating layer (not shown) covering the gate electrodes 12e and 12h.

The n-channel enhancement type field effect transistors 12a are arranged at first intervals T1, and the gate electrodes 12e are spaced from the signal line 12c and the gate electrodes 12h by a first distance D1.

On the other hand, the n-channel enhancement type test transistor 11 comprises an n-type source region 11a, an n-type drain region 11b, a gate insulating film over a channel region between the n-type source region 11a and the n-type drain region 11b and a gate electrode 11c.

Turning back to FIG. 3A, a dummy pattern 13 is provided for the gate electrode 11c, and dummy pattern components 13a, 13b and 13c and other dummy pattern components 13d, 13e and 13f are formed on both sides of the gate electrode 11c, respectively. The gate electrode 11c and the dummy pattern components 13a to 13f are surrounded by a peripheral dummy pattern 13g, and the gate electrode 11c is spaced from the peripheral dummy pattern 13g by a second distance D2 approximately equal to the first distance D1. The gate electrode 11c, the dummy pattern components 13a to 13f and the peripheral dummy pattern 13g are concurrently formed together with the shared gate electrode 12e and the signal line 12c through a dry etching in a fabrication process. The gate electrode 11c is spaced from the peripheral dummy pattern 13g by a second distance D2, and the gate electrode 11c and the dummy pattern components 13a to 13f are arranged at second intervals T2 approximately equal to the first interval T1. Thus, the dummy pattern components 13a to 13f increases the amount of material to be etched around the gate electrode 11c, and the gate electrode 11c is free from the loading effect in the dry etching stage. Moreover, the peripheral dummy pattern 13g surrounds the gate electrode 11c and the dummy pattern components 13a to 13f as similar to the signal line 12c and the gate electrodes 12h, and suppresses the micro loading effect in the dry etching to the same degree as the etching on the gate electrodes 12e/12h.

Although an inter-level insulating layer covers the shared gate electrodes 12e, the signal line 12c, the gate electrode 11c, the dummy pattern components 13a to 13f and the peripheral dummy pattern 13g, the inter-level insulating layer is deleted from the structure shown in FIGS. 3A and 3B.

Electrode pads 14a, 14b and 14c are patterned on the inter-level insulating layer (now shown), and are held in contact with the n-type source region 11a, the n-type drain region 11a and the gate electrode 11c through contact holes 15a, 15b and 15c formed in the inter-level insulating layer. When the semiconductor integrated circuit device is completed, the manufacturer appropriately biases the electrode pads 14a to 14c, and evaluates the n-channel enhancement type test transistor 11. The transistor characteristics thus evaluated are applicable to the n-channel enhancement type field effect transistors 12a and 12b, and the manufacturer determines whether or not the n-channel enhancement type field effect transistors 12a and 12b satisfy customer's specification.

Figure 4B:
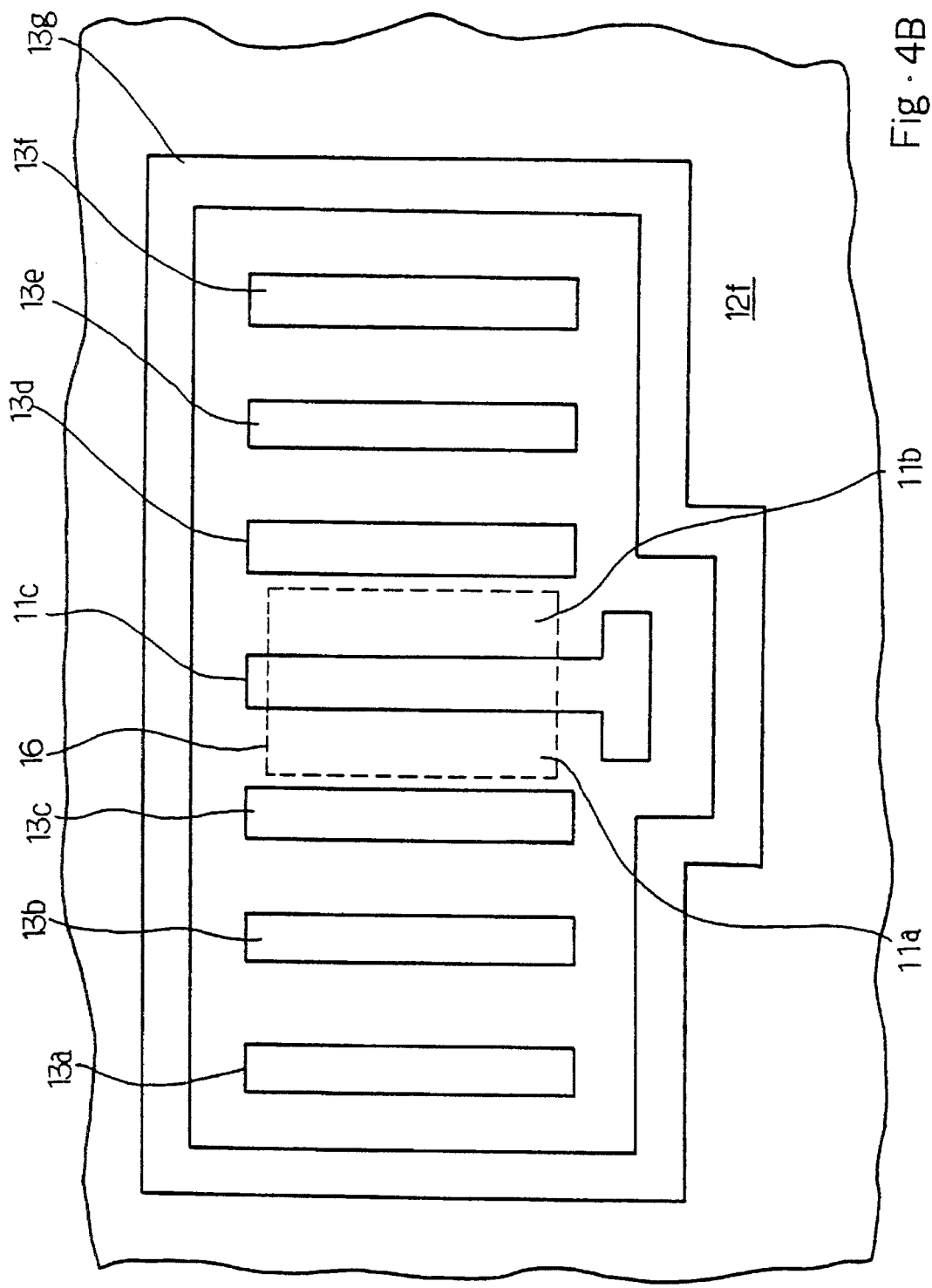
Figure 4C:
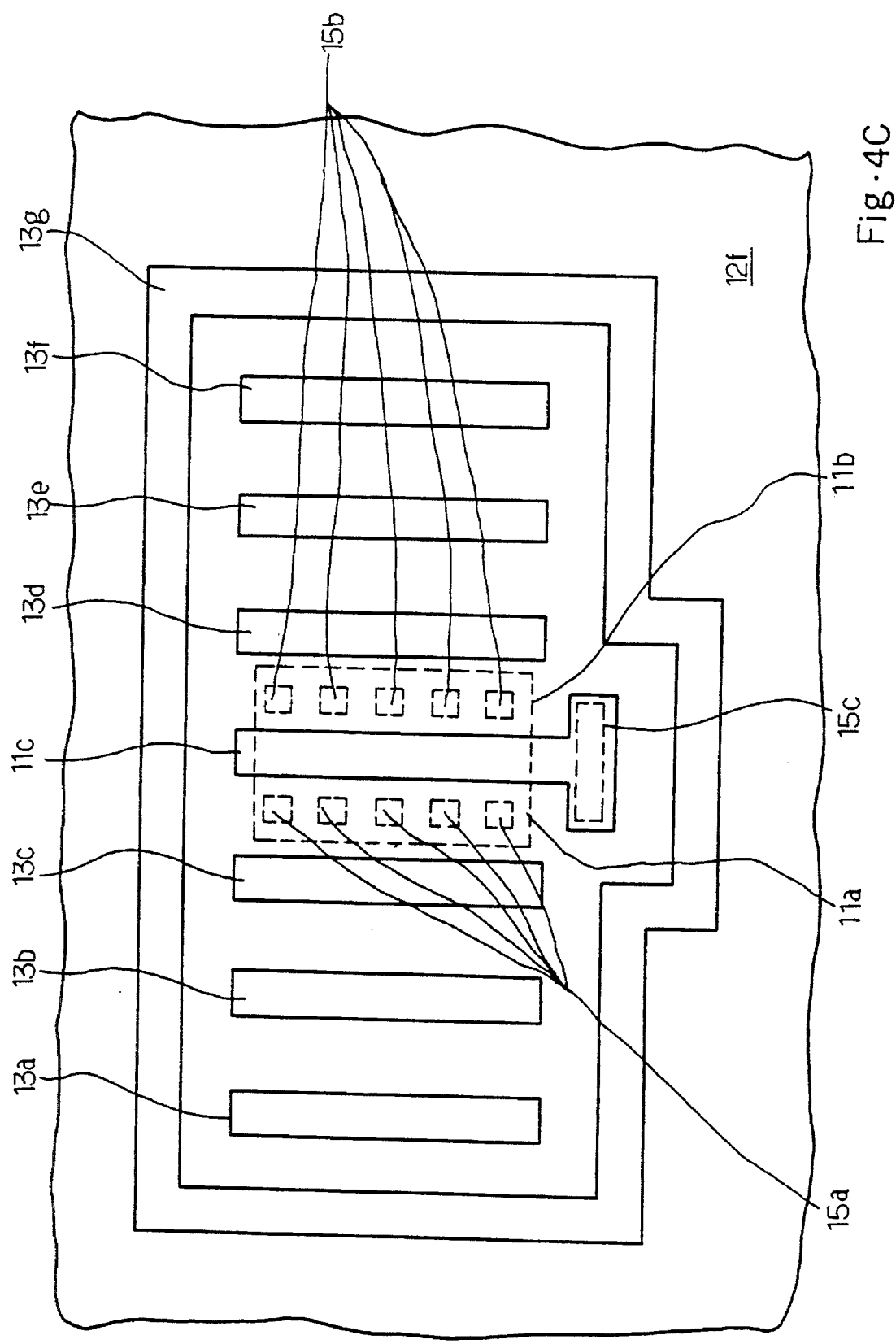

Description is hereinbelow made on the process sequence with reference to FIGS. 4A to 4C of the drawings. FIGS. 4A to 4C focus the process sequence on the n-channel enhancement type test transistor 11, the dummy pattern components 13a to 13f and the peripheral dummy pattern 13g. However, the description on the process sequence takes the n-channel enhancement type field effect transistors 12a and 12b into account.

First, the thick field oxide layer 12f is selectively grown on the major surface of the semiconductor substrate 10, and defines active areas 16. FIG. 4A illustrates one of the active areas 16. The n-channel enhancement type test transistor 11 is assigned to one of the active areas 16, and other active areas 16 are used for the n-channel enhancement type field effect transistors 12a and 12b.

Thin gate insulating films are thermally grown on the surfaces of the active areas 16, and a conductive substance such as a doped polysilicon is deposited over the entire surface of the structure. An appropriate photo-resist mask (not shown) is patterned on the conductive substance, and covers portions of the deposited conductive layer for the gate electrodes 12e, 12h, the signal line 12c, the gate electrode 11c, the dummy pattern components 13a to 13f and the peripheral dummy pattern 13g.

Using the photo-resist mask, the conductive substance is patterned through a dry etching, and the dry etching stage provides the gate electrodes 12e for the n-channel enhancement type field effect transistors 12a, the gate electrodes 12h for the n-channel enhancement type field effect transistors 12b, the signal line 12c, the gate electrode 11c for the n-channel enhancement type test transistor 11, the dummy pattern components 13a to 13f and the peripheral dummy pattern 13g. The micro loading effect is equivalent between the gate electrodes 12e/12h and the gate electrode 11c, and the gate electrodes 12e/12h are equal in width and thickness to the gate electrode 11c. The resultant structure at this stage is illustrated in FIG. 4B.

Using the gate electrodes 12e, 12h and 11c as masks, an n-type dopant impurity is ion implanted into the active areas 16, and the n-type source/drain regions 12d, 12g and 11a/11a are formed in the active areas 16.

An insulating substance such as, for example, silicon oxide is deposited over the entire surface of the structure, and forms the inter-level insulating layer (not shown). Contact holes are formed in the inter-level insulating layer, and contain the contact holes for the gate electrodes 12e and the contact holes 15a to 15c. The positions of the contact holes 15a, 15b and 15c are represented by squares and a rectangle drawn by broken lines.

An appropriate conductive substance such as, for example, aluminum is deposited over the entire surface of the structure, and the conductive layer is patterned into the control signal lines connected to the gate electrodes 12e and the electrode pads 14a to 14c.

Second Embodiment

Figure 5:
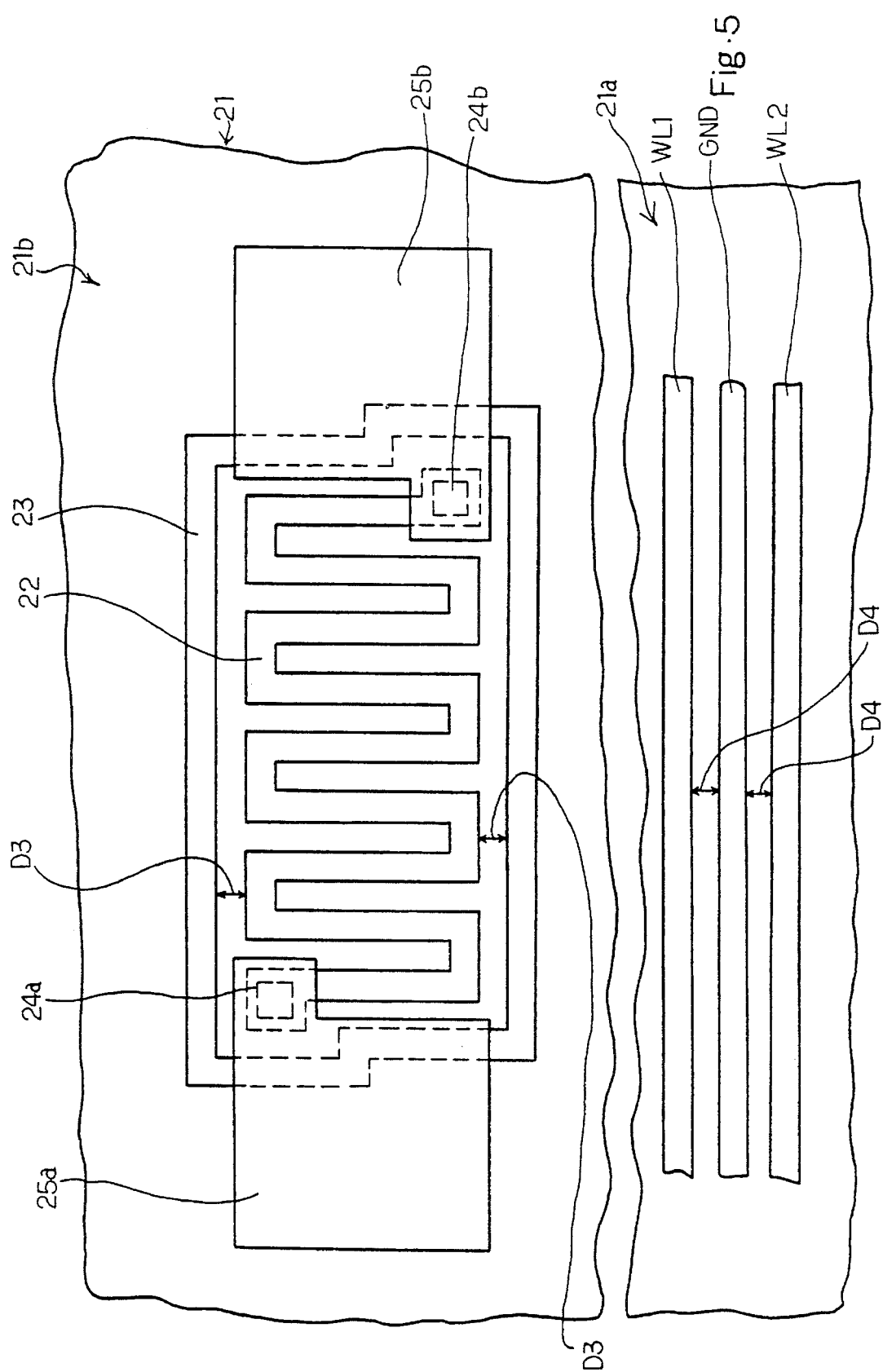
FIG. 5 is a plan view showing another test component and an associated peripheral dummy pattern incorporated in another semiconductor integrated circuit device according to the present invention.

Turning to FIG. 5 of the drawings, a semiconductor integrated circuit device embodying the present invention is fabricated on a semiconductor substrate 21. The semiconductor substrate 21 has a major area assigned to an integrated circuit and a test pattern area 21a for test components. A ground voltage line GND and other wirings WL1 and WL2 are incorporated in the integrated circuit, and extend in the major area 21a of the semiconductor substrate 21. An open-check pattern 22 is corresponding to the ground voltage line GND, and is formed in the test pattern area 21a as one of the test components.

Figure 6:
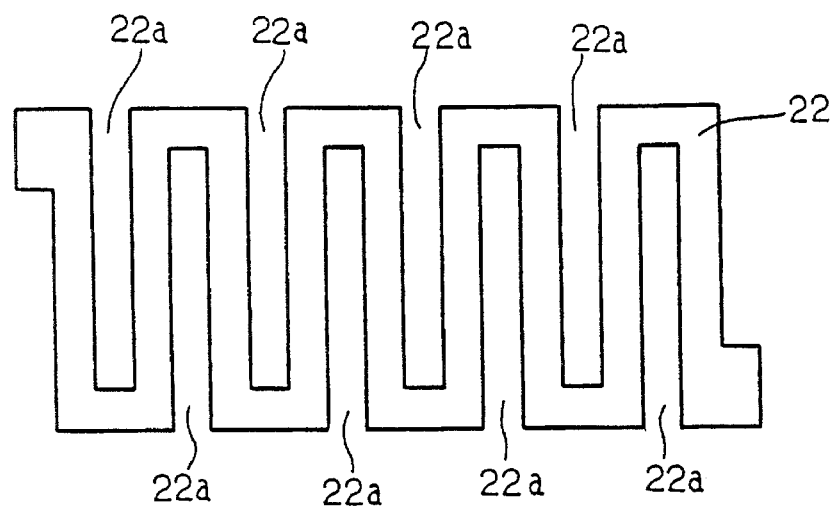
FIG. 6 is a plan view showing the test component.

Although a dummy pattern component is not associated with the open-check pattern 22, the open-check pattern 22 has open ends 22a (see FIG. 6), and the etching species can easily escape from the open-check pattern 22. On the other hand, other circuit components (not shown) of the integrated circuit are provided around the ground voltage line GND. For this reason, if a peripheral dummy pattern is not provided for the open-check pattern 22, the micro loading effect is not equivalent between the ground voltage line GND and the open-check pattern 22.

In this instance, a peripheral dummy pattern 23 surrounds the open-check pattern 22, and is patterned through a dry etching together with the open-check pattern 22, the wirings WL1 and WL2 and the ground voltage line GND. An inter-level insulating layer (not shown) covers the open-check pattern 22 and the peripheral dummy pattern 23, and contact holes 24a and 24b are formed in the inter-level insulating layer. Electrode pads 25a and 25b are formed on the inter-level insulating layer, and are held in contact with both end portions of the open-check pattern 22 through the contact holes 24a and 24b, respectively. A distance D3 between the open-check pattern 22 and the peripheral dummy pattern 23 is regulated to a distance D4 between the ground voltage line GND and the wirings WL1 and WL2 serving as second circuit components, and the peripheral dummy pattern 23 effectively prohibits the reaction product of the dry etching from escape through the open ends 22a.

Thus, the micro-loading effect is equivalent between the open-check pattern 22 and the ground voltage line GND, and the open-check pattern 22 is equivalent to the ground voltage line. For this reason, the manufacturer can evaluate the ground voltage line GND by using the open-check pattern 22, and the testing results are reliable.

Figure 7A:
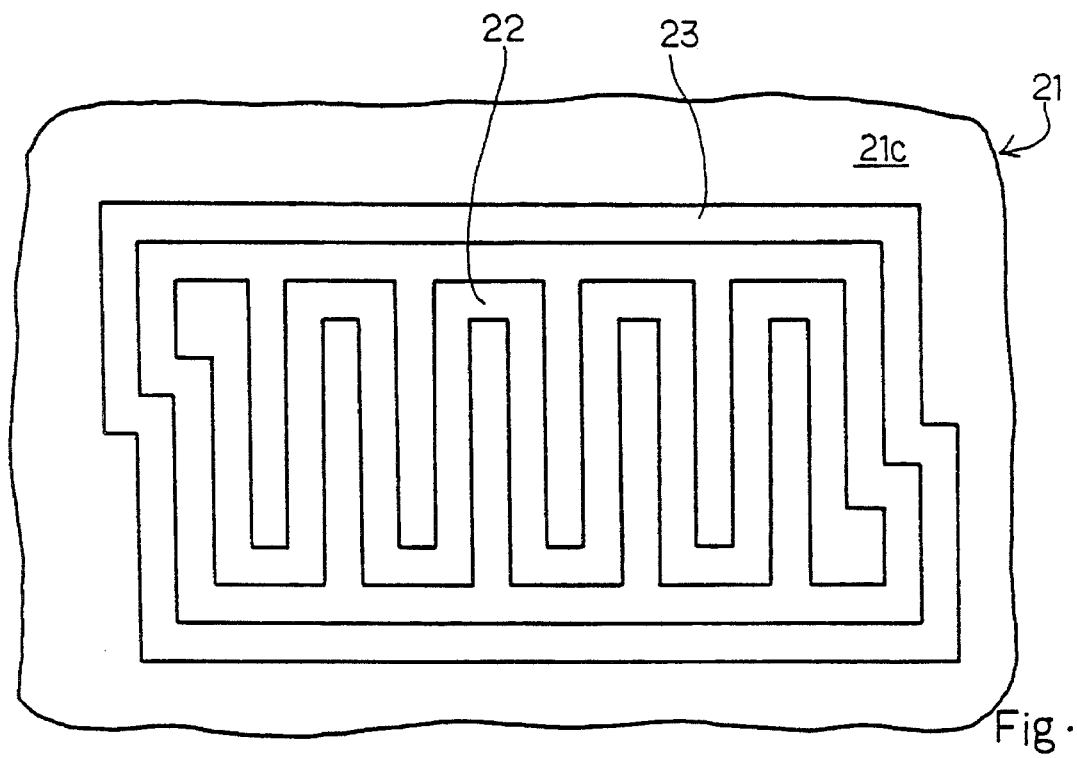
FIGS. 7A and 7B are plan views showing a process sequence for fabricating the test component and the peripheral dummy pattern.

The open-check pattern 22 and the peripheral dummy pattern are fabricated as follows. First, the semiconductor substrate 21 is selectively oxidized, and a thick field oxide layer 21c is formed on the major surface of the semiconductor substrate 21. A conductive substance is deposited over the thick field oxide layer 21c or an appropriate inter-level insulating layer, and a photo-resist mask is provided on the conductive substance layer in such a manner as to cover parts of the conductive substance layer for the ground voltage line GND, the wirings WL1 and WL2, the open-check pattern 22 and the peripheral dummy pattern 23. Using the photo-resist mask, the conductive substance layer is patterned through a dry etching, and the ground voltage line GND, the wirings, WL1/WL2, the open-check pattern 22 and the peripheral dummy pattern 23 are left on the thick field oxide layer 21c or the appropriate inter-level insulating layer. The peripheral dummy pattern 23 causes the open-check pattern 22 to be equal in width and thickness to the ground voltage line. FIG. 7A illustrates the open-check pattern 22 and the peripheral dummy pattern 23 at this stage.

Figure 7B:
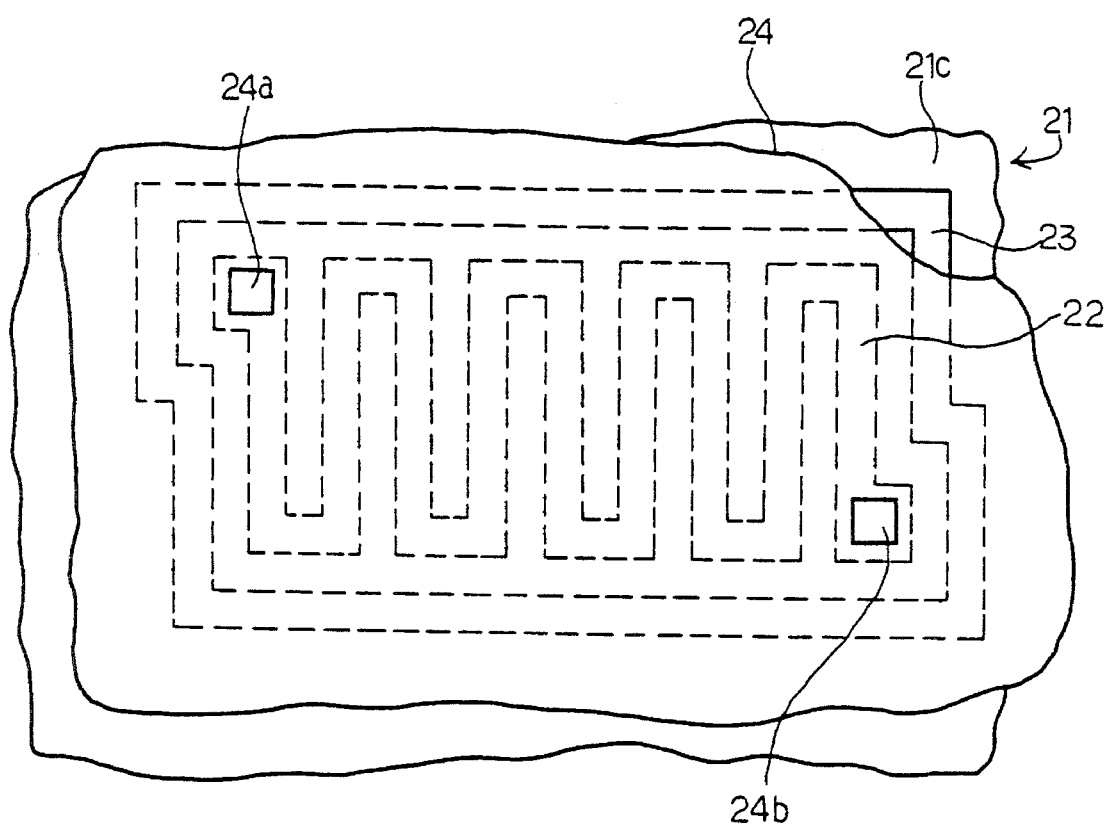

An inter-level insulating layer 24 is deposited over the open-check pattern 22 and the peripheral dummy pattern 23, and the contact holes 24a and 24b are formed in the inter-level insulating layer 24. The contact holes 24a and 24b expose both end portions of the open-check pattern 22 as shown in FIG. 7B.

An appropriate conductive substance such as aluminum is deposited over the inter-level insulating layer 24, and is patterned into the electrode pads 25a and 25b. The electrode pads 25a and 25b are held in contact with the both end portions through the contact holes 24a and 24b, respectively.

As will be understood from the foregoing description, the peripheral dummy pattern confines the reaction product in the dry etching stage, and makes the micro-loading effect equivalent between the test pattern in the test pattern area and the major pattern of the circuit components in the major area. As a result, the test pattern is equivalent to the major pattern, and the manufacturer exactly evaluates the circuit components by using the test pattern.

Although particular embodiments of the present invention have been shown and described, it will be obvious to those skilled in the art that various changes and modifications may be made without departing from the spirit and scope of the present invention.

What is claimed is:

1. A semiconductor integrated circuit device fabricated on a semiconductor substrate having a major area and a test pattern area, comprising:

a) an integrated circuit formed in said major area, and having a plurality of circuit components and a second circuit component, a plurality of pattern components being incorporated in said plurality of circuit components at first intervals, said second circuit component being spaced from said plurality of pattern components by a first distance;

b) a test component having a test pattern and used for evaluating at least one of said plurality of circuit components; and c) a peripheral dummy pattern formed in said test pattern area, surrounding said test component and spaced from said test pattern by a second distance equal to said first distance, said peripheral dummy pattern and said test pattern being concurrently patterned together with said plurality of pattern components.

2. The semiconductor integrated circuit device as set forth in claim 1, in which further comprising a plurality of dummy pattern components formed inside of said peripheral dummy pattern, said dummy pattern components being formed concurrently with said plurality of pattern components, said test pattern and said peripheral dummy pattern.

3. The semiconductor integrated circuit device as set forth in claim 2, in which said test pattern and said plurality of dummy pattern components are spaced from one another at second intervals equal to said first intervals.

4. The semiconductor integrated circuit device as set forth in claim 2, in which said dummy pattern components, said plurality of pattern components, said test pattern and said peripheral dummy pattern are patterned by using a dry etching.

5. A semiconductor integrated circuit device fabricated on a semiconductor substrate having a major surface and a test pattern area, comprising:

an integrated circuit formed in said major surface, and including a plurality of field effect transistors respectively having first gate electrodes spaced at first intervals and a second circuit component spaced from said gate electrodes by a first distance;

a test transistor formed in said test pattern area for evaluating said plurality of field effect transistors, and having a second gate electrode;

a plurality of dummy pattern components formed in said test pattern area and provided on both sides of said second gate electrode, said second gate electrode and said plurality of dummy pattern components being spaced at second intervals approximately equal to said first intervals; and a peripheral dummy pattern formed in said test pattern area, and surrounding said second gate electrode and said plurality of dummy pattern components, said peripheral dummy pattern being spaced from said second gate electrode by a second distance approximately equal to said first distance, said first gate electrodes, said second circuit component, said second gate electrode, said plurality of dummy pattern components and said peripheral dummy pattern being concurrently formed through a dry etching.

6. A semiconductor integrated circuit device fabricated on a semiconductor substrate having a major area and a test pattern area, comprising:

an integrated circuit formed in said major area, and having a first wiring line and second wiring lines formed therein, said second wiring lines being spaced from said first wiring line by a first distance;

an open-check pattern formed in said test pattern area for evaluating said first wiring line; and a peripheral dummy pattern formed in said test pattern area, and surrounding said open-check pattern, said peripheral dummy pattern being spaced from said open-check pattern by a second distance approximately equal to said first distance, said first wiring line, said second wiring lines, said open-check pattern and said peripheral dummy pattern being concurrently formed through a dry etching.

* * * * *